United States Patent [19]
Park et al.

[11] Patent Number: 6,022,764
[45] Date of Patent: Feb. 8, 2000

[54] EXPOSURE APPARATUS AND METHOD FOR FORMING THIN FILM TRANSISTOR

[75] Inventors: Cheol-Hee Park, Ich'on; Jong-Seok Jang, Seoul, both of Rep. of Korea

[73] Assignee: Hyundai Electronics Industries Co., Ltd., Ich'on, Rep. of Korea

[21] Appl. No.: 08/761,961

[22] Filed: Dec. 9, 1996

[30] Foreign Application Priority Data

Dec. 11, 1995 [KR] Rep. of Korea ............... 95-48282

[51] Int. Cl.⁷ .................................................. H01L 21/00
[52] U.S. Cl. .......................... 438/151; 438/160; 438/487
[58] Field of Search ........................... 438/151, 160, 438/487

[56] References Cited

U.S. PATENT DOCUMENTS

| | | | |
|---|---|---|---|
| 4,830,468 | 5/1989 | Stephany et al. | 350/336 |
| 4,857,428 | 8/1989 | Koike | 430/25 |
| 5,159,476 | 10/1992 | Hayashi | 359/54 |
| 5,311,041 | 5/1994 | Tominaga et al. | 257/66 |
| 5,336,930 | 8/1994 | Quach | 257/774 |
| 5,391,507 | 2/1995 | Kwasnick et al. | 437/41 |
| 5,440,189 | 8/1995 | Nakahata et al. | 310/313 |
| 5,712,191 | 1/1998 | Nakajima et al. | 437/174 |
| 5,716,759 | 2/1998 | Badehi | 413/313 |

FOREIGN PATENT DOCUMENTS

| | | |
|---|---|---|
| 62-20375 | 1/1987 | Japan . |
| 62-190768 | 8/1987 | Japan . |
| 3-154352 | 7/1991 | Japan . |
| 3-283529 | 12/1991 | Japan . |
| 6-273799 | 9/1994 | Japan . |
| 8-29809 | 2/1996 | Japan . |
| 8-172043 | 7/1996 | Japan . |
| 8-220769 | 8/1996 | Japan . |
| 9410929 | 11/1994 | Rep. of Korea . |

OTHER PUBLICATIONS

Wolf, S., Tauber R.N.; Silicon Processing for the VLSI Era vol. 1: Process Technology, Lattice Press, Sunset Beach, CA, p.p. 520–521, Jan. 1986.

Patent Abstracts of Japan, Publication No. 8–172043, Jul. 2, 1996.

Patent Abstracts of Japan, Publication No. 8–29809. Feb. 2, 1996.

Patent Abstract of Japanese Laid–Open No. 62–20375, Jan. 28, 1987.

Patent Abstract of Japanese Laid–Open No. 62–190768, Aug. 20, 1987.

Patent Abstact of Japanese Laid–Open No. 3–154352, Jul. 2, 1991.

Patent Abstract of Japanese Laid–Open No. 3–283529, Dec. 13, 1991.

Patent Abstracts of Japan, Publication No. 6–273799, Sep. 30, 1994.

Patent Abstracts of Japan, Publication No. 8–220769, Aug. 30, 1996.

Derwent Abstract of KR 94–10929.

*Primary Examiner*—John F. Niebling
*Assistant Examiner*—Christopher Lattin
*Attorney, Agent, or Firm*—Ware, Fressola, Van Der Sluys & Adolphson LLP

[57] ABSTRACT

The present invention discloses a technology for forming a thin film transistor. There is provided an insulating substrate having a gate electrode and a gate insulating layer for protecting the gate electrode thereon. A first semiconductor layer is then formed on the substrate. An insulating layer for etch stopper is formed on the first semiconductor layer and the gate insulating layer. A photoresist film is coated on the whole surface of the resultant structure. A selected portion of the photoreist film is exposed to light by projecting a linear light to a section starting from the backside of the substrate to the photoresist film, the substrate being moved horizontally. Etch stopper layer is formed by developing the exposed photoresist film and then removing the remaining photoresist film.

10 Claims, 5 Drawing Sheets

EXPOSURE APPARATUS AND METHOD FOR FORMING THIN FILM TRANSISTOR

BACKGROUND OF THE INVENTION

1. Field of the Invention

The present invention generally relates to a liquid crystal display device. More particularly, this invention relates to an exposure apparatus and method for forming a thin film transistor.

2. Description of the Related Art

Generally, liquid crystal display (LCD) devices have been widely used in displays such as television, computer monitors, and so forth. Among LCD devices, remarkable research and development has taken place for the so-called active matrix LCD (AMLCD). The AMLCD is characterized by high speed response, has the potential to accommodate a large number of pixels, and is anticipated to accomplish high display quality, large screen size, and a color screen.

According to the conventional AMLCD device, a gate line and a drain line are formed on a transparent insulating substrate, and a switching element and a pixel electrode are arrayed and designed at the cross point of the gate line and drain line.

Since operation of the pixel electrode is independently controlled by a switching element such as a diode or a thin film transistor, it is possible to operate the pixel electrode with high speed, to increase the number of pixel per unit area, or to increase the screen size.

In the above mentioned AMLCD device, a thin film transistor is mainly used as the switching element.

FIGS. 2A–2C are simplified cross-sectional views illustrating a method for forming a thin film transistor according to the conventional art.

Referring to FIG. 2A, a gate electrode 2 of an opaque metal layer is formed on a transparent insulating substrate 1. The transparent insulating substrate used herein is a glass substrate. A gate oxide layer 3 of silicon nitride or metal oxide is formed on the transparent insulating substrate 1. A first semiconductor layer 4 is formed on a selected portion of the gate oxide layer 3, the first semiconductor layer 4 being made of amorphous silicon and acting as a channel in the thin film transistor.

Referring to FIG. 2B, an insulating layer 5 acting as an etch stopper (hereinafter referred to as "etch stopper layer") is formed on the glass substrate where the first semiconductor layer 4 has been formed. The etch stopper layer 5 is made of silicon nitride having a property capable of absorbing moisture component, and has a lower etch rate than the first semiconductor layer 4. A photoresist film 6 is coated on the etch stopper layer 5 using a conventional method. Afterwards, a selected portion of the photoresist film 6 is exposed to light from the back side of the substrate 1. At this time, the light projected from a light source 100 is homogenized in its intensity by being reflected at first and second reflecting plates 101 and 102. The homogenized light is incident from the back side of the substrate 1 to the photoresist film 6 wherein opaque gate electrode 2 is used as a mask resulting in the formation of exposed portion 61 and 62.

FIG. 2C, the exposed portions 61 and 62 in the coated photoresist film 6 are removed using a general developing solution, resulting in the formation of a photoresist pattern 6A.

Thereafter, an etch stopper layer 5A is formed by patterning the etch stopper layer 5 using the photoresist pattern 6A, as shown in FIG. 2D. Afterwards, the photoresist pattern 6A is removed by a conventional plasma ashing step. Thereafter, n-typed impurity-doped amorphous silicon layer 7 and a metal layer 8 for source and drain electrodes are formed on the structure resulting from the above steps, in that order.

Referring to FIG. 2E, n-type impurity-doped amorphous silicon layer 7 and the metal layer 8 for source and drain electrodes are patterned such that their central portion is exposed, thereby forming ohmic contact layers 7A and 7B, source electrode 8A, and drain electrode 8B.

The etch stopper layer 5A used in the conventional thin film transistor is formed to decrease the number of masks using the back side exposure. When the back side exposure process is used, parallel plate light is incident to the glass substrate as shown in FIG. 2B, whereby the first semiconductor layer 4 has a wider extent than the gate electrode 2 and absorbs 90% or more of the incident light in the areas extending beyond the edges of the gate electrode. Thus, a sufficient amount of light does not come to be incident to the photoresist film 6 in those areas wherein the first semiconductor layer 4 inadvertently acts as a mask so that the shape of the formed etch stopper layer 5A is not entirely determined by the gate electrode 2 but also to some extent by the first semiconductor layer 4. In other words, the formed etch stopper layer 5A has a wider width than the gate electrode 2.

At this time, the width of the etch stopper layer 5A defines a channel length in the thin film transistor. Because of the above mentioned reasons, the increase in the channel length increases with the width of the etch stopper layer 5A. With increasing the channel length, signal delay time in the thin film transistor also increases. With the increase in the delay time, a residual image is axgenerated in the screen of LCD device, whereby display quality is lowered.

Moreover, even though the incident light is homogenized by the reflective plates, it is difficult for the incident light to maintain the same intensity, so that the light that approaches the photoresist film weakens in intensity. Thus, it is difficult for the photoresist film to be patterned to a desired shape. As a result, the shape of the etch stopper layer is deformed.

SUMMARY OF THE INVENTION

Accordingly, it is an object of this invention to provide a method for forming a thin film transistor capable of preventing deformation of an etch stopper layer by precisely defining the photoresist pattern for the formation of the etch stopper layer.

Another object of this invention is to provide a method for forming a thin film transistor having a short channel by forming an etch stopper layer whose width is equal or less than the width of the gate electrode.

A further object of this invention is to provide an exposure apparatus for forming a thin film transistor capable of obtaining a precise photoresist pattern for an etch stopper layer.

According to the present invention, there is, first, provided an insulating substrate having a gate electrode and a gate insulating layer thereon for protecting the gate electrode. A first semiconductor layer is then formed on the substrate. An insulating layer for etch stopper is formed on the first semiconductor layer and the gate insulating layer. A photoresist film is coated on the whole surface of the resultant structure. A selected portion of the photoresist film is exposed to light by projecting a linear light at a section starting from the backside of the substrate to the photoresist film, the substrate and the light being moved horizontally with respect to each other. An etch stopper layer is formed by developing the exposed photoresist film and then removing the remaining photoresist film.

According to another aspect of the present invention, an exposure apparatus includes a linear light source, a reflective plate for reflecting light projected from the linear light source, and a stage moving unit for horizontally moving the wafer mounted on the stage.

BRIEF DESCRIPTION OF THE DRAWINGS

Further objects and advantages of the present invention will be apparent from the following description, reference being had to the accompanying drawings wherein preferred embodiment of the present invention is clearly shown.

In the drawings.

DETAILED DESCRIPTION OF THE INVENTION

Figure 1A:
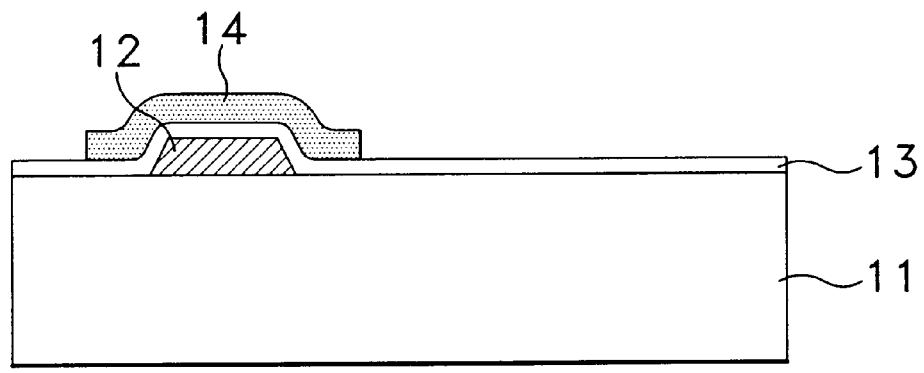
FIGS. 1A–1F are a simplified sectional views for describing a method of a thin film transistor according to one embodiment of the present invention.

Referring to FIG. 1A, a gate electrode 12 is formed on a selected portion of a transparent insulating substrate such as glass substrate and is made of an opaque metal such as aluminum or tantalum. The gate electrode 12 is etched by a tapering method wherein the gate electrode 12 is tapered such the width of its bottom face is greater than he width of its top face. The tilt is to prevent a gate insulating layer 13 from being torn by edges of the gate electrode 12. The gate insulating layer 13 is formed at a selected thickness on the insulating substrate and is made of either silicon oxide or two stacked layers of silicon nitride and silicon oxide. An amorphous silicon layer is deposited on the gate insulating layer 13 and is then patterned to cover the formed gate electrode 12, to form a semiconductor layer 14.

Figure 1B:
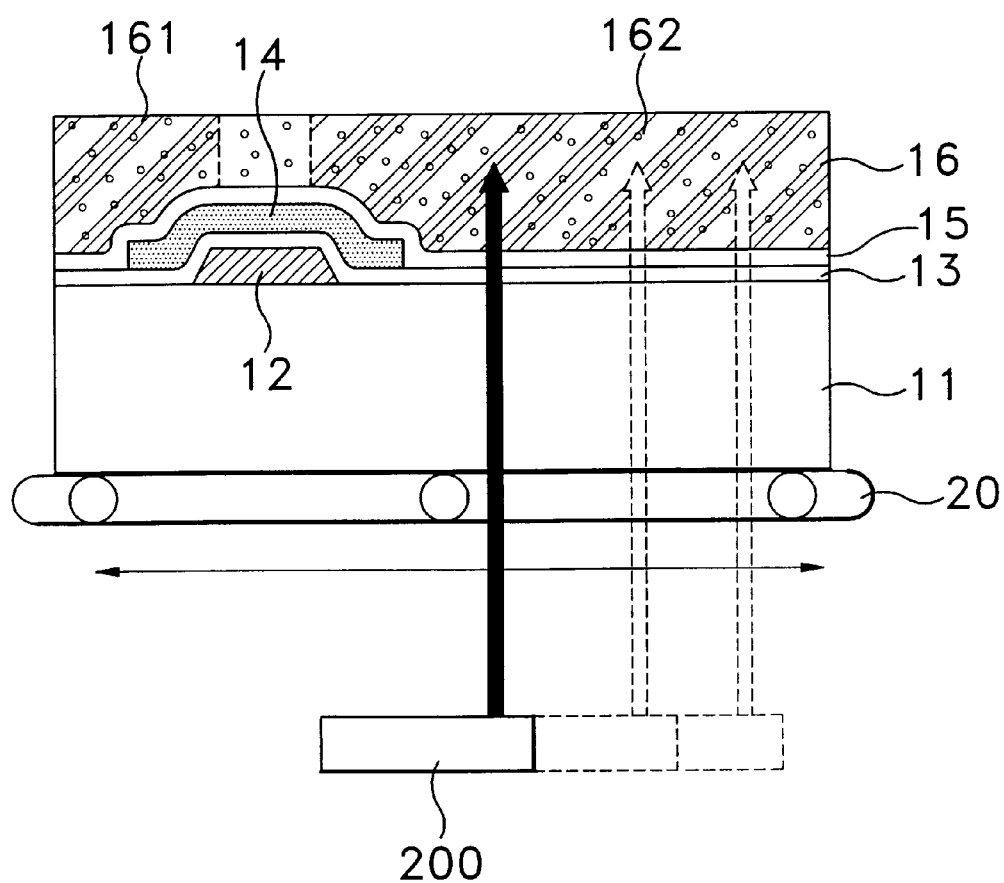

Referring to FIG. 1B, an etch stopper insulating layer 15 is formed on the insulating substrate on which the semiconductor layer 14 has been formed, and is made of a layer capable of absorbing moisture component and protecting the semiconductor layer 14. An example of such a layer is silicon nitride. A photoresist film 16 is formed on the whole surface of the glass substrate 11 using a spin coating method. Afterwards, the substrate 11 is loaded onto an exposure apparatus of the present invention.

The exposure apparatus includes a mounting part for mounting the glass substrate with the overlying photoresist film 16 and then aligning it, and a light generating part 200. A moving part 20 such as a conveyor belt is established at the back side of the mounting part to move the glass substrate 11. In addition, the light projected from the light generating part 200 has a high intensity, and is a linear light which is incident to unidirection. Moreover, the light generating part 200 includes a lamp, a light covering part for making the projected light unidirectional, and a least one or more reflective plates for homogenizing the projected light intensity.

The linear light projected from the light generating part 200 is incident to unidirection to the glass substrate 11. The glass substrate 11 loaded in the exposure apparatus is exposed while is moving by the conveyor belt 20. The overlying photoresist film 16 is exposed by a conventional exposure method, but the substrate's moving velocity on the conveyor belt 20 is adjusted to control the exposure time of light projected upon selected portions of the photoresist film 16, as needed. In other words, in order to prevent the etch stopper insulating layer 15 to be patterned from being too wide, the exposure time, of where the semiconductor layer 14 is formed, beyond the edges of the gate electrode is extended, whereby a sufficient amount of light is incident upon the selected portions of the photoresist film 16.

Figure 1C:
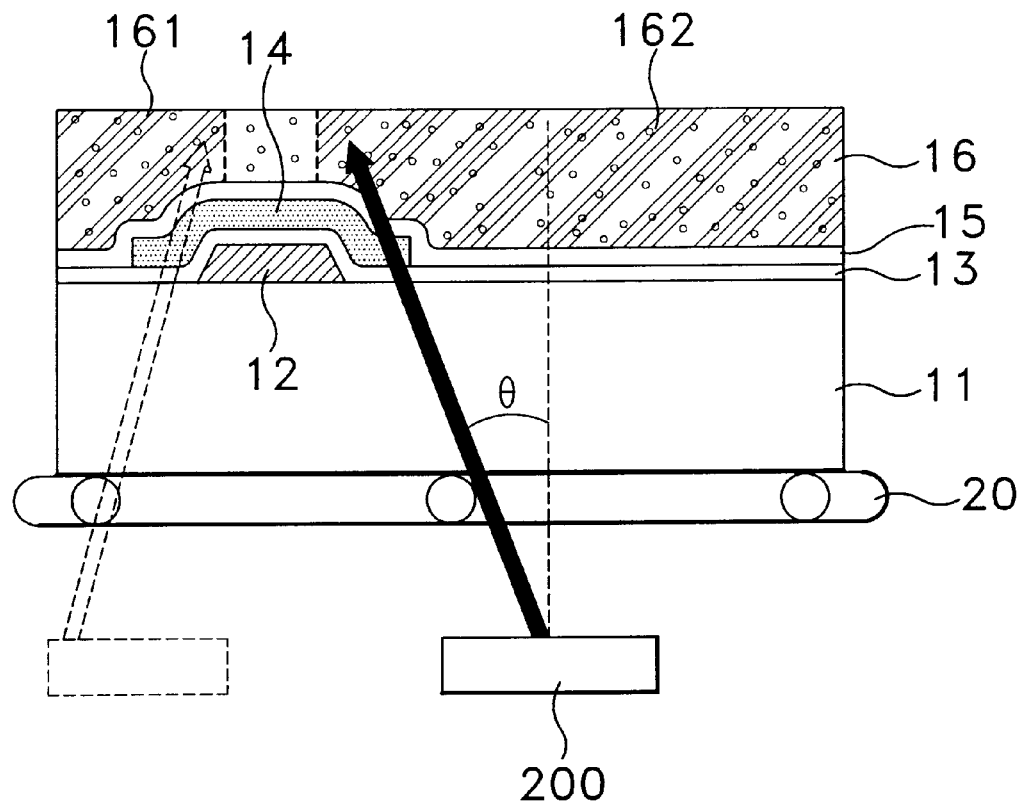

On exposing the photoresist film 16 on the gate electrode 12, the light can be made incident to the glass substrate 11 at a selected angle θ as shown in FIG. 1C. The purpose is to allow the width of the exposed portions of the pattern formed to be equal or less than the width of the gate electrode 12.

Figure 1D:
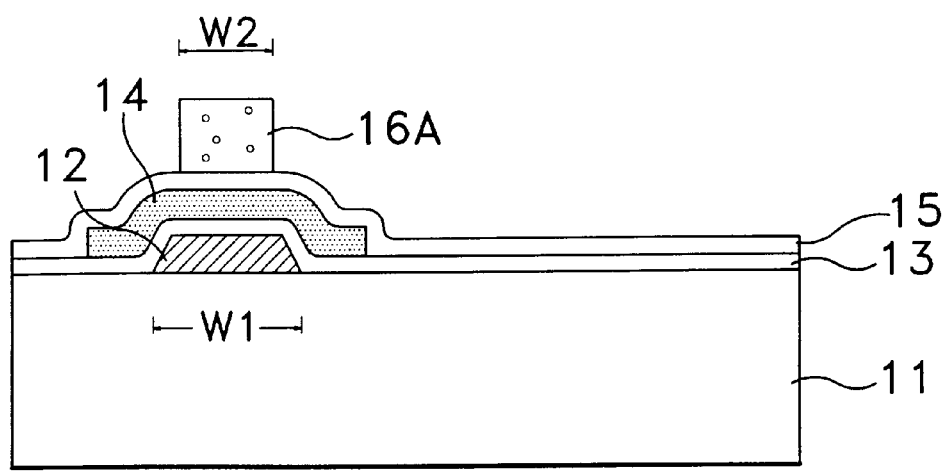

Referring to FIG. 1D, the exposed portions 161 and 162 of the photoresist film 16 are removed by a conventional developing process, resulting in the formation of a photoresist pattern 16A. The width of the photoresist pattern 16A is smaller than or equal to that of the gate electrode 12.

Figure 1E:
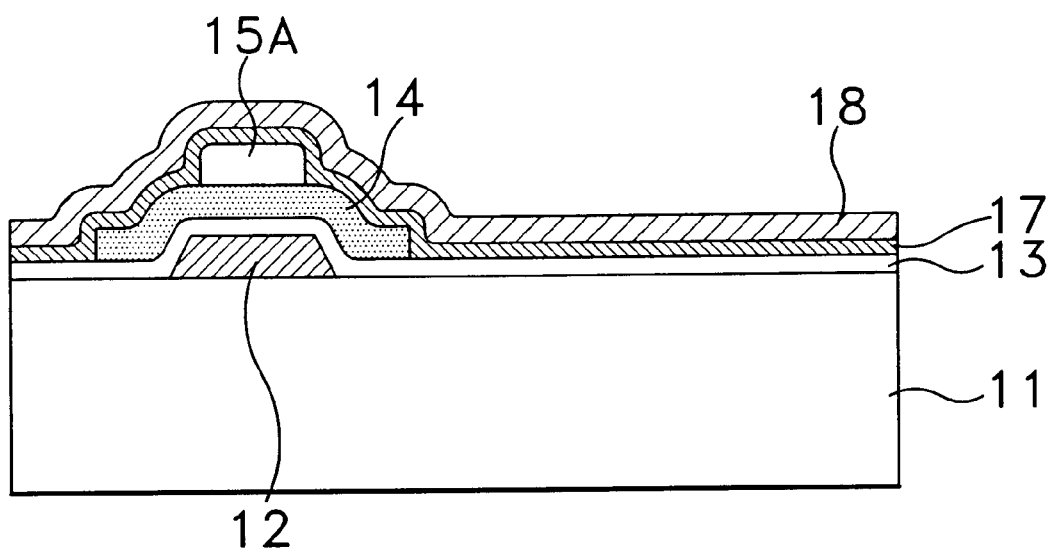
Figure 1F:
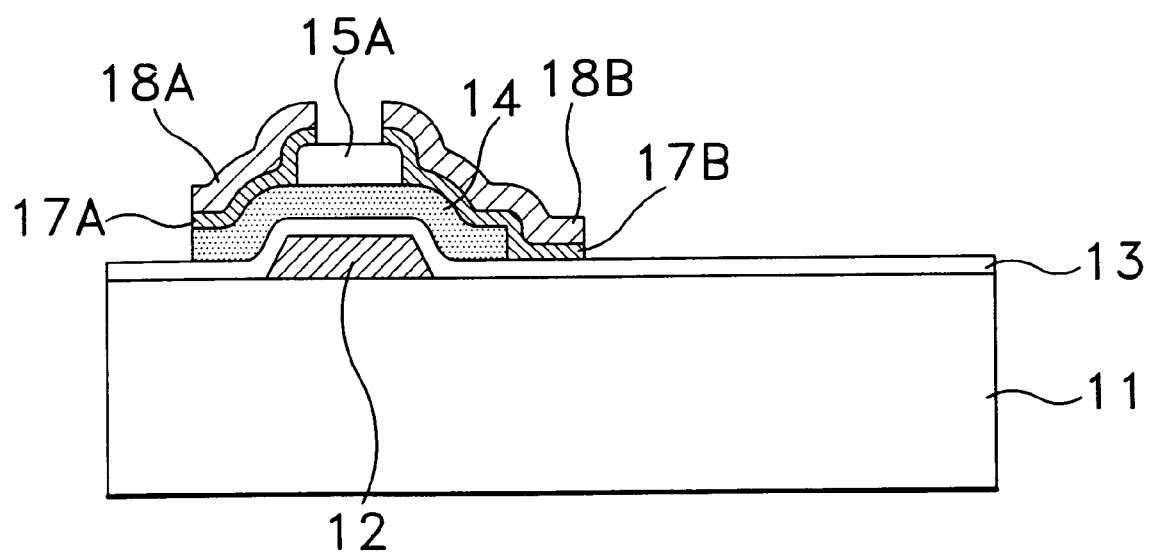
Figure 2A:
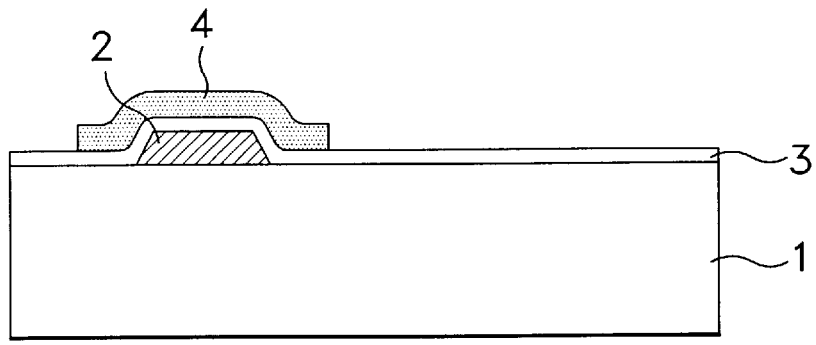
FIGS. 2A–2E are a simplified sectional views for describing a method of forming a thin film transistor according to the conventional art.
Figure 2B:
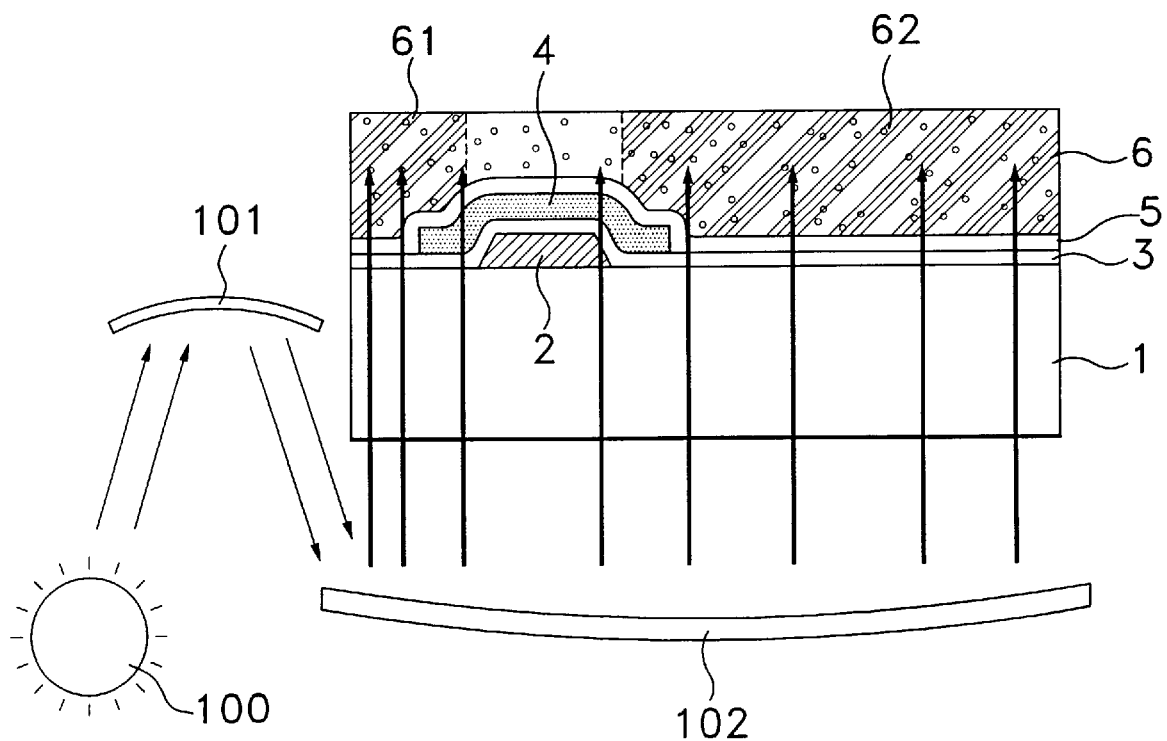
Figure 2C:
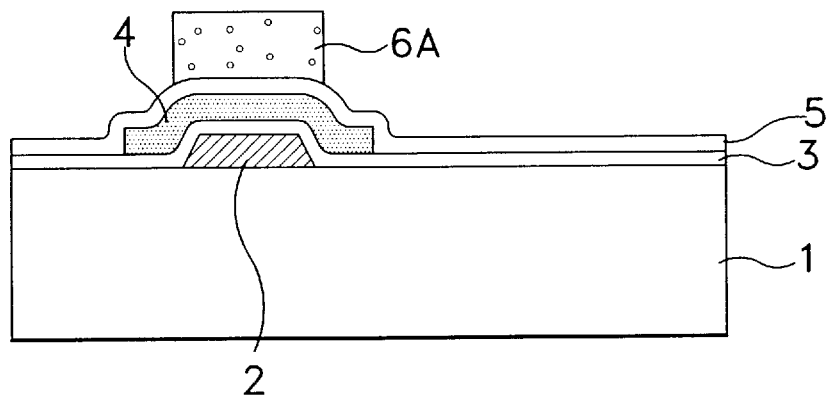
Figure 2D:
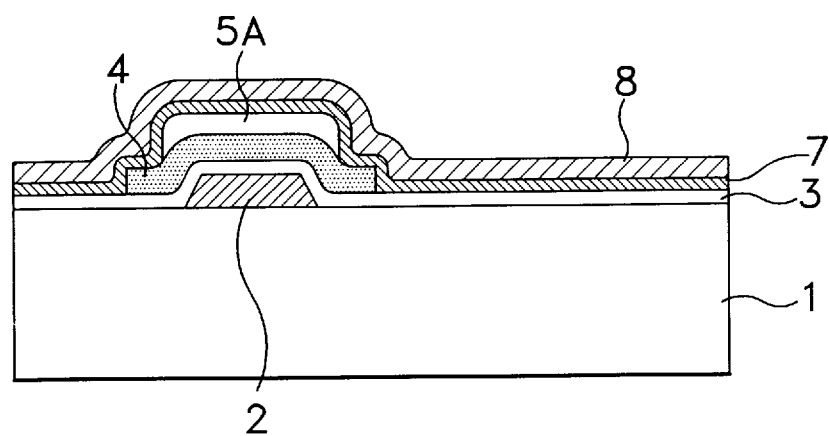
Figure 2E:
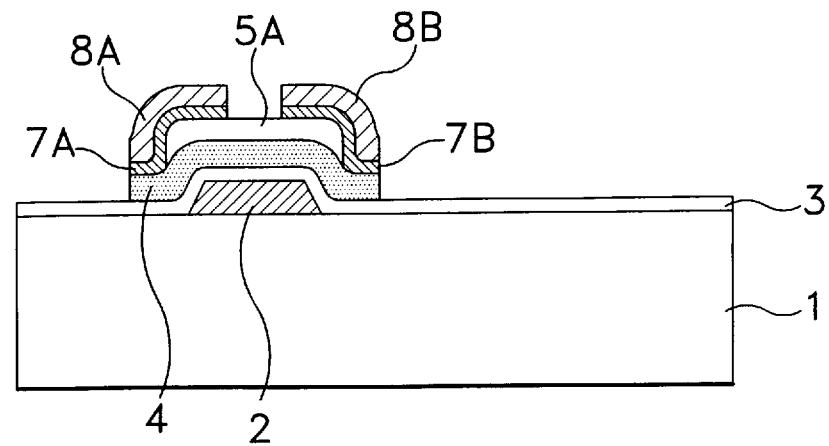

Referring to FIG. 1E, the etch stopper insulating layer 15 is patterned to the shape of the photoresist pattern 16A and then the photoresist pattern 16A is removed, whereby an etch stopper 15A is formed. Thereafter, impurity-doped amorphous silicon layer 17 for ohmic contact and a metal layer 18 for source and drain are deposited in that order by a conventional method. Afterwards, the impurity-doped amorphous silicon layer 17 and the metal layer 18 are etched to a selected pattern, thereby forming ohmic contact layers 17A and 17B, and source and drain electrodes 18A and 18B.

As described previously, through the above-mentioned processes, the so-formed etch stopper 15A, has the same or a smaller width than the gate electrode 12, thereby decreasing the channel length of the so formed thin film transistor. As a result, signal delay time in the LCD decreases and the residual image in the screen also decreases.

Other features, advantages and embodiments of the invention disclosed herein will be readily apparent to those exercising ordinary skill after reading the foregoing disclosure. In this regard, while specific embodiments of the invention have been described in considerable detail, variations and modifications of these embodiments can be effected without departing from the spirit and scope of the invention as described and claimed.

What is claimed is:

1. A method for forming a thin film transistor comprising the steps of:

providing an insulating substrate having a gate electrode and a gate insulating layer thereon for protecting the gate electrode;

forming a first semiconductor layer on the substrate;

forming an insulating layer for etch stopper on the first semiconductor layer and the gate insulating layer;

coating a photoresist film on the whole surface of the resultant structure;

exposing a selected portion of the photoresist film to light by projecting a linear light to a section starting from the backside of the substrate to the photoresist film, the substrate being moved horizontally;

forming an etch stopper layer by developing the exposed photoresist film; and removing the remaining photoresist film.

2. The method in accordance with claim 1, wherein said etch stopper layer is silicon nitride layer.

3. The method in accordance with claim 1, wherein said insulating substrate is declined during the exposing step.

4. The method in accordance with claim 1, wherein said method further comprises the steps of:

depositing an impurity-doped amorphous silicon layer and a metal layer for source and drain on the whole surface, in that order after the step for removing the remaining photoresist film; and etching the impurity-doped amorphous silicon layer and the metal layer for source and drain to form ohmic contact layer, and source and drain electrodes.

5. The method of claim 1, wherein the etch stopper layer has a width less than a width of the gate electrode.

6. The method of claim 4, wherein the etch stopper layer has a width less than a width of the gate electrode.

7. A method for forming a thin film transistor comprising the steps of:

providing an insulating substrate having a gate electrode and a gate insulating layer thereon for protecting the gate electrode;

forming a first semiconductor layer on the substrate;

forming an insulating layer for forming an etch stopper on the first semiconductor layer and the gate insulating layer;

coating a photoresist film on the whole surface of the resultant structure;

exposing a selected portion of the photoresist film to light by projecting a linear light to a section starting from the backside of the substrate to the photoresist film, the substrate and the light being moved horizontally with respect to each other; and forming an etch stopper photoresist pattern over the gate electrode having a shape with a width less than a width of the gate electrode by developing and removing the exposed photoresist film, patterning an etch stopper insulating layer to the shape of the etch stopper photoresist pattern, and then removing the etch stopper photoresist pattern for forming an etch stopper layer.

8. The method in accordance with claim 5, wherein said etch stopper layer is a silicon nitride layer.

9. The method in accordance with claim 5, wherein said insulating substrate is inclined during the exposing step.

10. The method in accordance with claim 5, wherein said method further comprises the steps of:

depositing an impurity-doped amorphous silicon layer and a metal layer for source and drain on the whole surface, in that order after the step for forming the etch stopper layer; and etching the impurity-doped amorphous silicon layer and the metal layer for source and drain to form ohmic contacts with source and drain electrodes.

* * * * *

UNITED STATES PATENT AND TRADEMARK OFFICE
CERTIFICATE OF CORRECTION

PATENT NO : 6,022,764
DATED : February 8, 2000
INVENTOR(S): Park et al

It is certified that error appears in the above-identified patent and that said Letters Patent is hereby corrected as shown below:

At col. 2, line 35, change "axgenerated" to --generated--.

At col. 3, line 19, after "method of", insert --forming--;

at line 32, after "than", change "he" to --the--;

at line 58, change "unidirection" to --unidirectionally--;

at line 64, change "unidirection" to --unidirectionally--; and

Signed and Sealed this

Thirtieth Day of January, 2001

Attest:

Q. TODD DICKINSON

*Attesting Officer*  *Director of Patents and Trademarks*